US008624997B2

(12) United States Patent
Kuang et al.

(10) Patent No.: US 8,624,997 B2
(45) Date of Patent: Jan. 7, 2014

(54) ALTERNATIVE COLOR IMAGE ARRAY AND ASSOCIATED METHODS

(75) Inventors: Jiangtao Kuang, Sunnyvale, CA (US); Donghui Wu, Sunnyvale, CA (US); Jizhang Shan, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 324 days.

(21) Appl. No.: 13/035,785

(22) Filed: Feb. 25, 2011

(65) Prior Publication Data

US 2011/0279705 A1 Nov. 17, 2011

Related U.S. Application Data

(63) Continuation-in-part of application No. PCT/US2010/049368, filed on Sep. 17, 2010.

(60) Provisional application No. 61/334,886, filed on May 14, 2010.

(51) Int. Cl.
*H04N 5/235* (2006.01)
*H04N 3/14* (2006.01)

(52) U.S. Cl.
USPC .............. 348/229.1; 348/230.1; 348/277; 348/297; 348/221.1

(58) Field of Classification Search
USPC .............. 348/273, 277, 280, 276, 281, 222.1, 348/220.1, 221.1, 362, 297, 229.1, 230.1
See application file for complete search history.

(56) References Cited

U.S. PATENT DOCUMENTS

| 7,479,998 | B2 * | 1/2009 | Mitsunaga et al. | ........... 348/273 |
| 2004/0080652 | A1 * | 4/2004 | Nonaka et al. | ................ 348/312 |
| 2004/0141075 | A1 | 7/2004 | Xu et al. | |
| 2006/0192873 | A1 | 8/2006 | Yaffe | |
| 2007/0045681 | A1 | 3/2007 | Mauritzson et al. | |
| 2007/0273785 | A1 * | 11/2007 | Ogawa et al. | ................. 348/362 |
| 2007/0285526 | A1 * | 12/2007 | Mann et al. | ................. 348/222.1 |
| 2009/0009623 | A1 | 1/2009 | Hoshino | |
| 2009/0059048 | A1 * | 3/2009 | Luo et al. | ...................... 348/308 |

FOREIGN PATENT DOCUMENTS

WO          2006049098        11/2006

OTHER PUBLICATIONS

Mase, Mitsuhito et al., "A Wide Dynamic Range CMOS Image Sensor With Multiple Exposure-Time Signal Outputs and 12-Bit Column-Parallel Cyclic A/D Converters," IEEE Journal of Solid-State Circuits, vol. 40, No. 12, Dec. 2005 pp. 2787-2795.

(Continued)

*Primary Examiner* — Nhan T Tran
(74) *Attorney, Agent, or Firm* — Lathrop & Gage LLP

(57) ABSTRACT

An image sensor includes an array of light sensitive elements and a filter array. Each filter element is in optical communication with a respective light sensitive element. The image sensor receives filtered light having a repeating pattern. Light sensitive elements in at least two successive rows alternately receive light having a first color and a second color, and light sensitive elements in common columns of the successive rows alternately receive light having the first color and the second color. Light sensitive elements in at least two additional successive rows alternately receive light having a third and a fourth color, and light sensitive elements in common columns of the additional successive rows alternately receive light having the third color and the fourth color. Output values of pairs of sampled light sensitive elements receiving light of a common color and from successive rows are combined to generate a down-sampled image.

3 Claims, 10 Drawing Sheets

(56) References Cited

OTHER PUBLICATIONS

Schrey, O. et al., "A 1K×1K High Dynamic Range CMOS Image Sensor With On-Chip Programmable Region of Interest Readout," Fraunhofer Institute of Microelectronic Circuits and Systems, Finkenstra.beta.e 61, D-47057 Duisburg, Germany, 4 pages.

Yadid-Pecht, O. et al., "Wide Intrascene Dynamic Range CMOS APS Using Dual Sampling," IEEE Transactions on Electron Devices, vol. 44, No. 10, Oct. 1997, pp. 1721-1723.

European Search Report for Application No. 08252842.3 mailed on Nov. 24, 2008, 8 pages.

File History of related European Patent Application Serial No. 08252842.3, dated Aug. 28, 2008 through Feb. 16, 2010, 136 pages.

\* cited by examiner

ALTERNATIVE COLOR IMAGE ARRAY AND ASSOCIATED METHODS

RELATED APPLICATIONS

This application is a continuation-in-part of International Application No. PCT/US2010/049368 filed Sep. 17, 2010, which claims priority to U.S. Patent Application Ser. No. 61/334,886, filed May 14, 2010, each of which are incorporated herein by reference.

BACKGROUND

CMOS image sensors are typically formed as an array of pixels, where each pixel includes a photodetector that transforms incident light photons into current signals. Each pixel may also include other known elements, such as a reset switch, a signal amplifier, and output circuits that operate to set the exposure time of the photodetector and perform a read out indicative of light photons incident thereon. Where incident light is too high for the set exposure time of the pixel, the photodetector typically saturates.

FIG. 1 illustrates a prior art CMOS image sensor pixel array 100. Pixel array 100 is configured for column parallel readout and has a plurality of columns, each having a pixel 102 for each of a plurality of rows. In column parallel readout architecture, for each row, one pixel 102 in each column is read out and processed simultaneously. That is, pixels 102 of Row 0 are read out in parallel, then pixels 102 of Row 1 are read out in parallel, then pixels 102 of Row 2 are read out in parallel, and so on, until Row M is read out. Pixels 102 within each column connect to a column readout line 105, such that when a row is triggered for output, each pixel in that row outputs a signal to its associated column readout line 105, while outputs of other pixels in the column remain inactive. Array 100 is shown with one sample and hold element 104 for each column read out line 105. Sample and hold elements 104 and column read out lines 105 cooperate to provide a row-by-row read out of pixels 102. A second stage amplifier 106 connects to each of the sample and hold elements 104. All rows are typically output to form an image (also known as a frame).

CMOS image sensors are often used in applications in which both very bright and very dark conditions are encountered. A variety of techniques have been developed to improve the response of CMOS image sensors in a variety of light conditions. For example, U.S. Patent Publication No. 2004/0141075, entitled "Image Sensor Having Dual Automatic Exposure Control", by Xiangchen Xu et al., is assigned to Omnivision Technologies, Inc. and is hereby incorporated by reference. Xu teaches that the gain and exposure time can be adjusted over a sequence of frames to compensate for varying light conditions. An adjustment in exposure time is determined by analyzing one frame and then used to make an adjustment for a subsequent frame. While such approach controls exposure times over a series of frames to adjust for bright and dark conditions, it does not result in an increase in the dynamic range of the image sensor for a particular frame. As is well known in the field of image sensors, the dynamic range is the ratio of the largest detectable signal to the smallest, which for a CMOS image sensor is often defined by the ratio of the largest non-saturating signal to the standard deviation of the noise under dark conditions.

U.S. Patent Publication No. 2009/0059048, entitled "Image Sensor with High Dynamic Range in Down-Sampling Mode", by Xiaodong Luo et al, is also assigned to Omnivision Technologies, Inc. and is hereby incorporated by reference. Luo introduces a system and method to achieve a high dynamic range in a down-sampling operation mode by varying exposure times for different pixel rows and combining rows with different exposures, thus simultaneously reducing the vertical resolution and extending the dynamic range.

In down-sampling, a binning process is used to combine data from two or more pixels to increase a signal to noise ratio (SNR), and a high dynamic range (HDR) combination process is used to combine data from two or more pixels to increase dynamic range. In the binning process, all rows have the same exposure time, while in the HDR combination process, rows of pixels can have different exposure times.

A Bayer pattern, which is one of the most commonly used patterns for down-sampling, generates zigzag edges during both the HDR combination process and the binning process. Although corrective algorithms for these zigzag edges have been developed for use with the Bayer pattern, these corrective algorithms have certain disadvantages, such as reducing sharpness and resolution of output frames and increasing cost of image sensors. For example, a binning re-interpolation algorithm can partly smooth zigzag edges caused by the Bayer pattern, but with a sacrifice in sharpness and resolution of the resultant frame. Re-interpolation also becomes very expensive since more memory is necessary.

BRIEF SUMMARY

The present disclosure presents a modified Bayer pattern as an alternative to the conventional Bayer pattern. The down-sampling problem of a zigzag effect resulting from binning or HDR combination of pixel values configured in a conventional Bayer pattern is solved by using a modified Bayer pattern. A sensor having pixels based upon the modified Bayer pattern outputs images with smooth edges without sacrificing sharpness or resolution. Image sensors based upon the modified Bayer pattern have less edge zigzag and have improved sharpness and resolution in generated images.

In an embodiment, an image sensor includes an array of light sensitive elements and a filter array including a plurality of red, green, and blue filter elements. Each filter element is in optical communication with a respective light sensitive element. Each red filter element is configured to transmit only red colored light, each green filter element is configured to transmit only green colored light, and each blue filter element is configured to transmit only blue colored light. The filter array is arranged such that successive columns of the filter array have alternating first and second configurations. The first configuration is characterized by a repeating pattern of successive blue, green, red, and green filter elements, and the second configuration is characterized by a repeating pattern of successive green, blue, green, and red filter elements.

In an embodiment, a method for down-sampling an image produced by an image sensor including an array of light sensitive elements includes filtering light incident on the image sensor. The light is filtered such that successive columns of the array of light sensitive elements alternately receive light having a first pattern and a second pattern. The first pattern is characterized by each four successive light sensitive elements in a column respectively receiving blue, green, red, and green colored light. The second pattern is characterized by each four successive light sensitive elements in a column respectively receiving green, blue, green, and red colored light. The method further includes sampling output values of the light sensitive elements and combining output values of pairs of light sensitive elements to generate a down-sampled image.

In an embodiment, a method for down-sampling an image produced by an image sensor including an array of light sensitive elements includes filtering light incident on the image sensor. The light is filtered such that successive columns of the array of light sensitive elements alternately receive light having a first pattern and a second pattern. The first pattern is characterized by each four successive light sensitive elements in a column respectively receiving blue, green, red, and green colored light. The second pattern is characterized by each four successive light sensitive elements in a column respectively receiving green, blue, green, and red colored light. The method additionally includes sampling output values of the light sensitive elements such that light sensitive elements of successive rows alternately have long and short exposure times. The method further includes combining output values of pairs of light sensitive elements to generate a down-sampled image.

In an embodiment, an image sensor has an array of light sensitive elements and a filter array including a plurality of first, second, third, and fourth filter elements, each filter element in optical communication with a respective light sensitive element. Each first filter element is configured to transmit light of a first color, each second filter element is configured to transmit light of a second color, each third filter element is configured to transmit light of a third color, and each fourth filter element is configured to transmit light of a fourth color. The filter array is configured to include a repeating pattern of filter elements characterized by: at least two successive rows of alternating first and second filter elements where common columns of the at least two successive rows also include alternating first and second filter elements, and at least two additional successive rows of alternating third and fourth filter elements where common columns of the at least two additional successive rows also include alternating third and fourth filter element elements.

In an embodiment, a method down-samples an image produced by an image sensor including an array of light sensitive elements. Light incident on the image sensor is filtered such that the image sensor receives light having a repeating pattern characterized by: (a) light sensitive elements in at least two successive rows alternately receiving light having a first color and a second color, and light sensitive elements in common columns of the at least two successive rows alternately receiving light having the first color and the second color, and (b) light sensitive elements in at least two additional successive rows alternately receive light having a third and a fourth color, and light sensitive elements in common columns of the at least two additional successive rows alternately receiving light having the third color and the fourth color. Output values of the light sensitive elements are sampled, and output values of pairs of light sensitive elements receiving light of a common color and from successive rows of the array are combined to generate a down-sampled image.

DETAILED DESCRIPTION

In the following description, the terms sensor array, pixel array, and image array may be used interchangeably to mean an array of photosensors.

Figure 1:
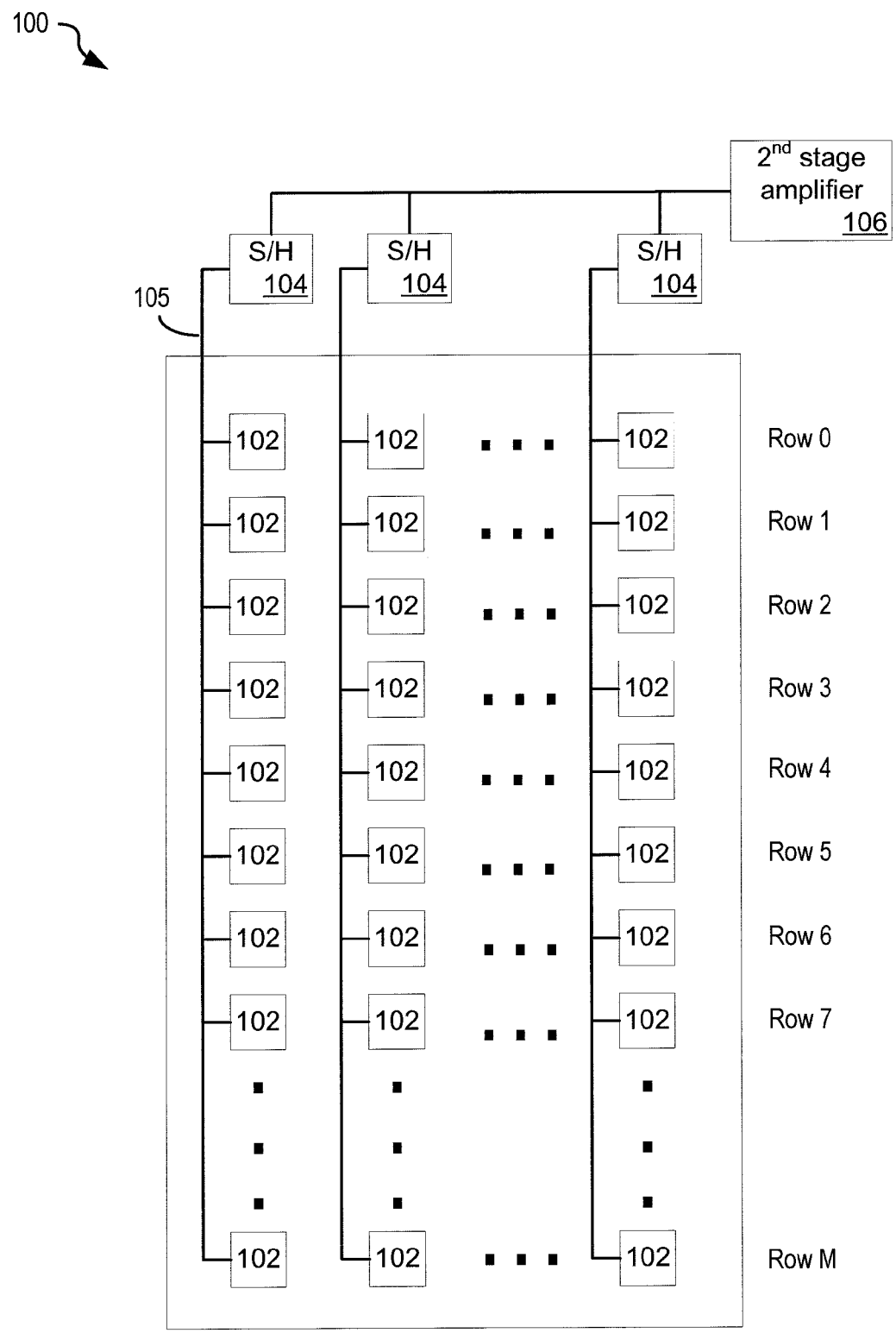
FIG. 1 illustrates operation of a prior art image sensor.
Figure 2:
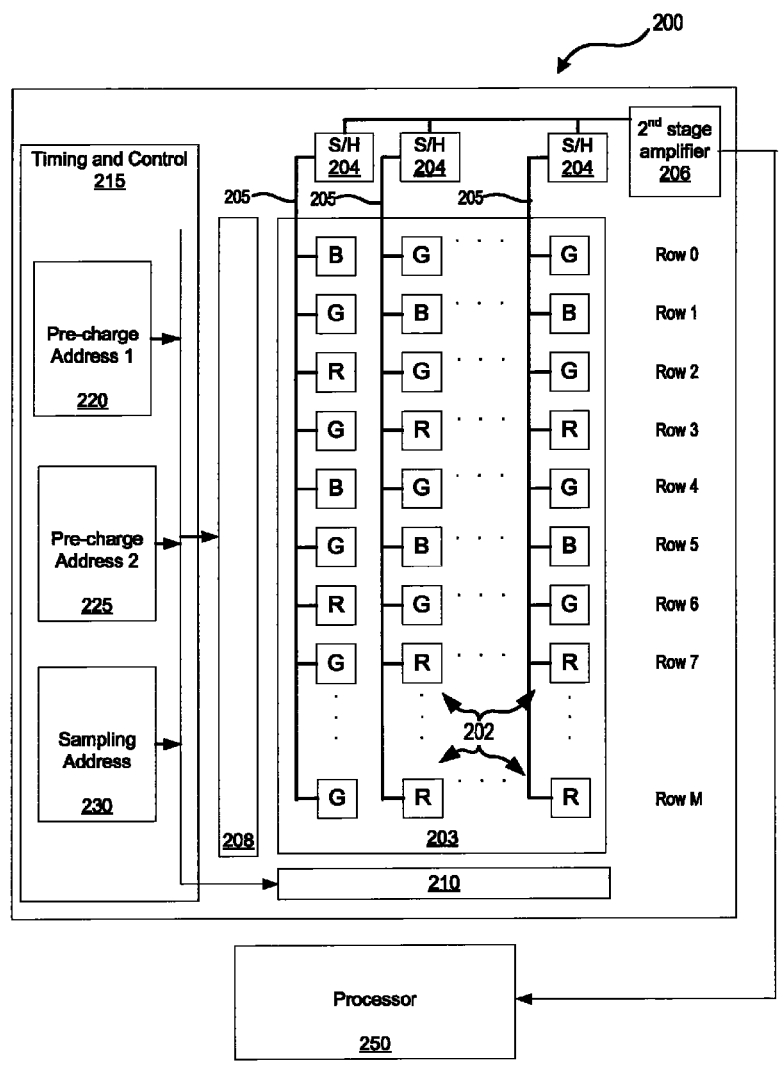
FIG. 2 is a block diagram illustrating one exemplary modified Bayer pattern imaging system that supports down-sampling with both a high dynamic range combination and binning, according to an embodiment.

FIG. 2 is a block diagram illustrating one exemplary modified Bayer pattern image sensor 200 that supports down-sampling with both a high dynamic range (HDR) combination and binning. Certain components are omitted for clarity of illustration. Image sensor 200 includes an image array 203 that has a plurality of light sensitive elements or photo-sensitive pixels 202 arranged as a plurality of rows and a plurality of columns and a filter array including a number of filter elements. Each filter element is in optical alignment with a respective pixel and is configured to allow light of only a certain color to pass through. The filter array conforms to a modified Bayer pattern defining the color sensitivity of each pixel 202. That is, color of pixel sensors within image array 203 conform to the exemplary modified Bayer pattern sensor 400 of FIG. 4. Image sensor 200 may be implemented as a complementary metal-oxide-semiconductor (CMOS) image sensor where each pixel 202 includes a photodetector and associated circuitry that supports setting an exposure time and reading out pixel values.

As shown, image array 203 has a column parallel readout architecture where, for each row, pixels 202 are read out simultaneously and processed in parallel. For each column, a readout line 205 connects, in parallel, to pixels 202 of that column and to a sample and hold (S/H) element 204. Outputs of S/H elements 204 connect to a second stage amplifier 206, which in turn connects to a processor 250. Processor 250 processes signals (i.e., image sensor data) from amplifier 206 to generate an image. Processor 250 may be implemented as a digital signal processor having a local line memory.

A row address decoder 208 and a column address decoder 210 operate to decode signals from a timing and control block 215 to address pixels 202. Timing and control block 215 includes a first pre-charge address block 220, a second pre-charge address block 225, and a sampling address block 230. The first pre-charge address block 220 may be set to a first pre-charge value, and the second pre-charge address block 225 may be set to a second pre-charge value. In one example of operation, sampling address 230 of timing and control block 215 selects a row, and a pre-charge is applied to pixels of that row from either the first pre-charge address block or the second pre-charge address block.

In one embodiment, the first pre-charge address block 220 supports a full resolution mode with the same gain and exposure time setting for each row. The first pre-charge address block 220 also supports a down-sampling mode that reduces resolution and permits the same exposure time to be set for all the rows during binning to achieve high SNR. The first pre-charge address block 220 and the second pre-charge address block 225 cooperate to support a down-sampling mode that reduces resolution and permits different exposure times to be set for different rows during the HDR combination process to achieve high dynamic range. Additional pre-charge address blocks (not shown) may be included within timing and control block 215 to provide additional pre-charge values for additional down-sampling modes.

The resolution of an image generated by processor 250 using data from image sensor 200 depends upon how the raw pixel data generated by photo-sensitive pixel elements is sampled and processed to generate pixels for the processed image. The term "raw pixel data" is used to distinguish data generated by image sensor 200 from the pixel data after the raw data has been sampled and performed additional signal processing by processor 250. In particular, the raw pixel data received from image sensor 200 may be down-sampled to reduce the effective vertical resolution of the processed image. A variety of standard resolution formats are used in the image sensing art. For example, a 1.3 megapixel super extended graphics array (SXGA) format has 1280×1024 pixels of resolution while a video graphics array (VGA) format has a resolution of 640×480 pixels.

In accordance with an embodiment, in a down-sampling mode, the vertical resolution of the raw pixel data is reduced by processor 250 to implement format conversion and simultaneously achieve a higher dynamic range. For example, when converting a 1.3 megapixel format into VGA, a down sampling mode may be selected that also provides a higher dynamic range. In this example, the down-sampling mode implements a 1:2 reduction in vertical resolution, and thus, since there is a simple geometric ratio of 1:2 in vertical resolution, down-sampling may combine data from two rows (e.g., Row 0 and Row 1) of pixels 202. In particular, processor 250 operates to combine raw pixel data values to generate pixel values in the final image. Where the first of the two rows being combined has a first pre-charge value (e.g., as set from the first pre-charge address block 220) and the second of the two rows has a second pre-charge value (e.g., as set from the second pre-charge address block 225), values resulting from two different exposure times controlled by the pre-charge values are processed by processor 250 to effectively increase the dynamic range of array 200, as compared to the dynamic range when full resolution is used. In one example, even rows (e.g., Row 0, Row 2, Row 4, . . . . Row M−1) have a long exposure time and odd rows (e.g., Row 1, Row 3, Row 5, . . . . Row M) have a short exposure time.

As previously described, in one embodiment, processor 250 includes a local line memory to store and synchronize the processing of lines having either the same or different row exposure times. In particular, the local memory may be used to store sets of long exposure rows and short exposure rows sampled at different times to permit aligning and combining rows with either the same or different exposure times. In one embodiment, during down-sampling, processor 250 reads the memory and combines the raw pixel data of pixels that are neighbors along the vertical dimension that are of a compatible type and that have the same exposure time for the binning process. In another embodiment, during down-sampling, processor 250 reads the memory and selects the raw pixel data of pixels that are neighbors along the vertical dimension that are of a compatible type and that have the different exposure times for the HDR combination process.

The exposure time of a pixel affects its output response. When a pixel is operated with a long exposure time, the pixel is very sensitive to received light, but tends to saturate at a low light level. In contrast, when the pixel is operated with a short exposure time, the pixel is less sensitive to light, and saturates at a higher light level as compared to operation with a short exposure time. Thus, by using different exposure times for rows that are down-sampled, a higher dynamic range is achieved as compared to down-sampling of rows with the same exposure time.

Various extensions and modifications of the down-sampling mode with high dynamic range are contemplated. In a first scenario, any down-sampling mode with a 1:N reduction (where N is an integer value) in vertical resolution may be supported, such as 1:2, 1:3, 1:4 and so on. In this scenario, the exposure times of the rows are varied in an interleaved sequence of row exposure times that permits down-sampling to be achieved with increased dynamic range. For example, for down-sampling with a 1:3 reduction in vertical resolution, the three rows that are to be combined have a sequence of a long exposure time, medium exposure time, and short exposure time.

In the HDR combination process, implemented within processor 250, rows of pixels have different exposure times. By combining data from two or more pixels of rows having different exposure times, dynamic range may be increased. There are many ways of combining the data from long exposure pixels and short exposure pixels. In one way, data is selected from either the long exposure pixel or the short exposure pixel. In particular, data from pixels of long exposure time (L pixels) are selected by processor 250 where the L pixels are not saturated, and data from pixels of short exposure time (S pixels) are selected by processor 250 where the L pixels are saturated. Where the short exposure data is selected by processor 250, the S pixel data is normalized to match the scale of long exposure pixels. For example, $$\text{data}_N = \text{data}_O * (L\_exposuretime/S\_exposuretime) \quad (1)$$

Where $\text{data}_N$ is the determined normalized pixel data value, $\text{data}_O$ is the original pixel data value, L_exposuretime represents the long exposure time, and S_exposuretime represents the exposure time of the selected pixel data value. If the pixel data value selected has the short exposure time, $\text{data}_N$ is normalized based upon the long exposure time as shown in Equation (1). If the pixel data value selected has the long exposure time, $\text{data}_N$ is the same as $\text{data}_O$.

In one embodiment, when HDR combination is not required, all rows of pixels are configured to have the same exposure time. Binning of two rows having the same exposure time achieves a higher signal to noise ratio (SNR) in the down-sampling.

Down-sampling modes that have higher dynamic range are also compatible with a variety of color filter array formats. In color sensing arrays in the art, a color filter array pattern is applied to an array of photosensors such that output from the photosensors creates a color image. The incoming light to each photosensor is filtered such that typically each photosensor in the pixel array records only one color, such as red, green or blue. In one embodiment, for a particular color filter array pattern, the row exposure times used in down-sampling are selected such that pixels having compatible filter types are combined during down-sampling.

Figure 3:
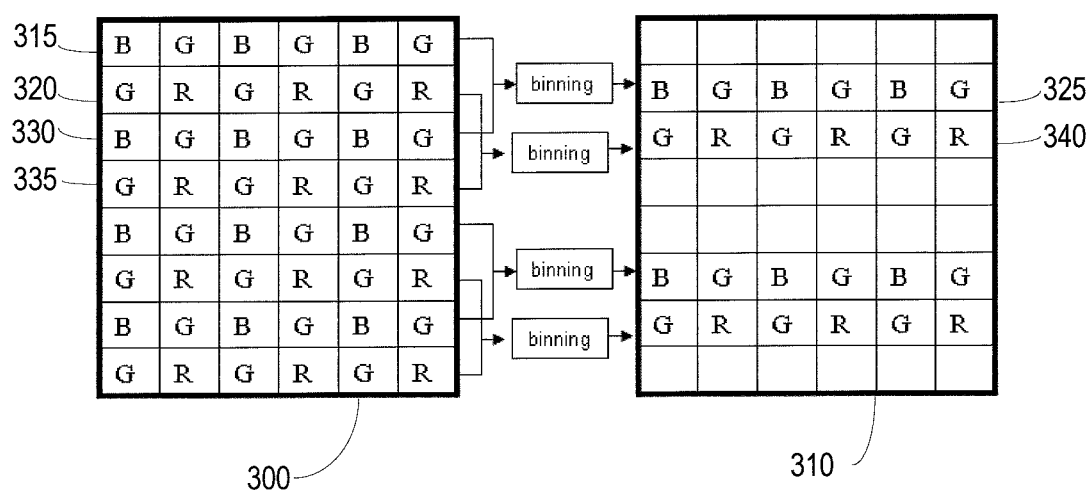
FIG. 3 illustrates binning for a conventional Bayer pattern in a down-sampling mode.

FIG. 3 illustrates prior art binning in a down-sampling mode for a Bayer pattern sensor 300. Binning results 310 after down-sampling are shown in the right portion of FIG. 3. In Bayer pattern sensor 300, a blue-green-blue-green (BGBG) row 315 of pixels is followed by a green-red-green-red (GRGR) row 320 of pixels. The Bayer pattern is a RGB filter pattern that is 50% green, 25% red, and 25% blue. In the Bayer pattern sensor, a blue-green row of pixels is followed by a green-red row of pixels. Other similar patterns include the CYGM filter array pattern (cyan, yellow, green, and magenta) formed of alternate rows of cyan-yellow and green-magenta, and a RGBE filter array pattern (red, green, blue, and emerald) having alternating rows of red-green and blue-emerald. Patterns may also include clear pixels, such a Red-Green-Blue-Clear (RGBC) and similarly, Red-Green-Blue-White (RGBW). As noted above, the problem with prior art sensor that utilize the Bayer pattern, is that significant zig-zagging results during the binning process.

Figure 4:
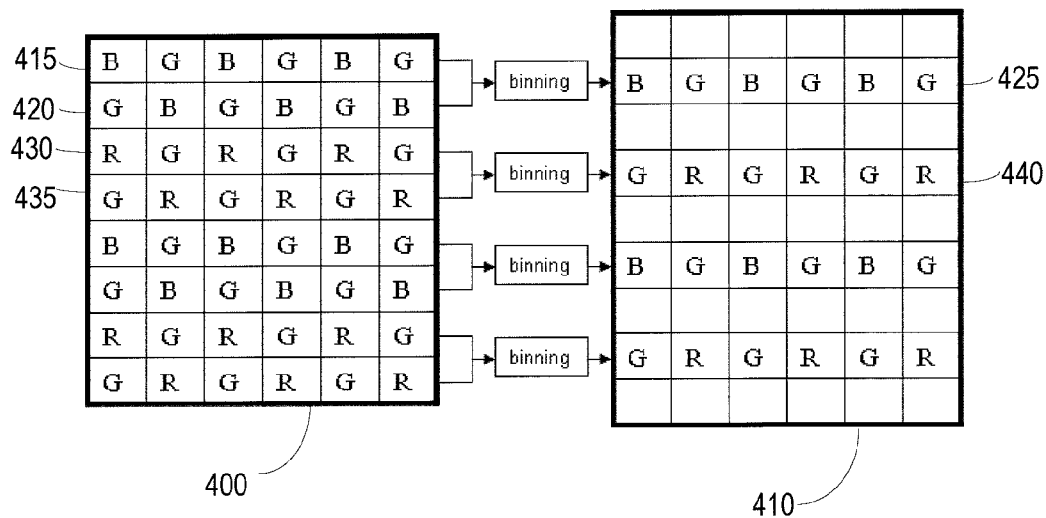
FIG. 4 illustrates binning for an exemplary modified Bayer pattern in a down-sampling mode, according to an embodiment.

FIG. 4 illustrates exemplary binning in a down-sampling mode for a modified Bayer pattern sensor 400. Modified Bayer pattern sensor 400 may represent image array 203 of FIG. 2; a down sampling result 410 (the right portion of FIG. 4) illustrates binning results after down-sampling and has a conventional Bayer pattern as a result of binning. In the modified Bayer pattern sensor 400, a blue-green row of pixels is followed by a green-blue row of pixels, which is followed by a red-green row of pixels, which is followed by a green-red row of pixels. Within the modified Bayer pattern sensor 400, the rows of colors repeat every four rows. This novel pattern is modified from the Bayer pattern sensor 300 by inserting row GBGB 420 and row RGRG 430 between row BGBG 415 and row GRGR 435 that are equivalent to respective row BGBG 315 and row GRGR 320 of the Bayer pattern sensor 300. Row GBGB 420 is formed by shifting elements G and B of row BGBG 415 to one column to either the right or to the left. Row RGRG 430 is formed by shifting elements G and R of row GRGR 435 to one column to either the right or the left.

With the modified Bayer pattern sensor 400, the rows have four color patterns that repeat every four rows: Blue-Green-Blue-Green (BGBG) 415, Green-Blue-Green-Blue (GBGB) 420, Red-Green-Red-Green (RGRG) 430, and Green-Red-Green-Red (GRGR) 435, and so on in repeating sequence. In this example all rows have the same exposure time. The repeating sequence is selected to be compatible with the modified Bayer pattern, which also repeats after every four rows. Binning of BGBG row 415 and GBGB row 420 generates a single BGBG row 425 after down-sampling in which the G combines data from the two green pixels of the two rows having the same exposure times, the B combines data from the two blue pixels of the two rows having the same exposure times, and so on. Similarly binning of RGRG row 430 and GRGR row 435 generates a single GRGR row 440 after down-sampling.

Figure 5:
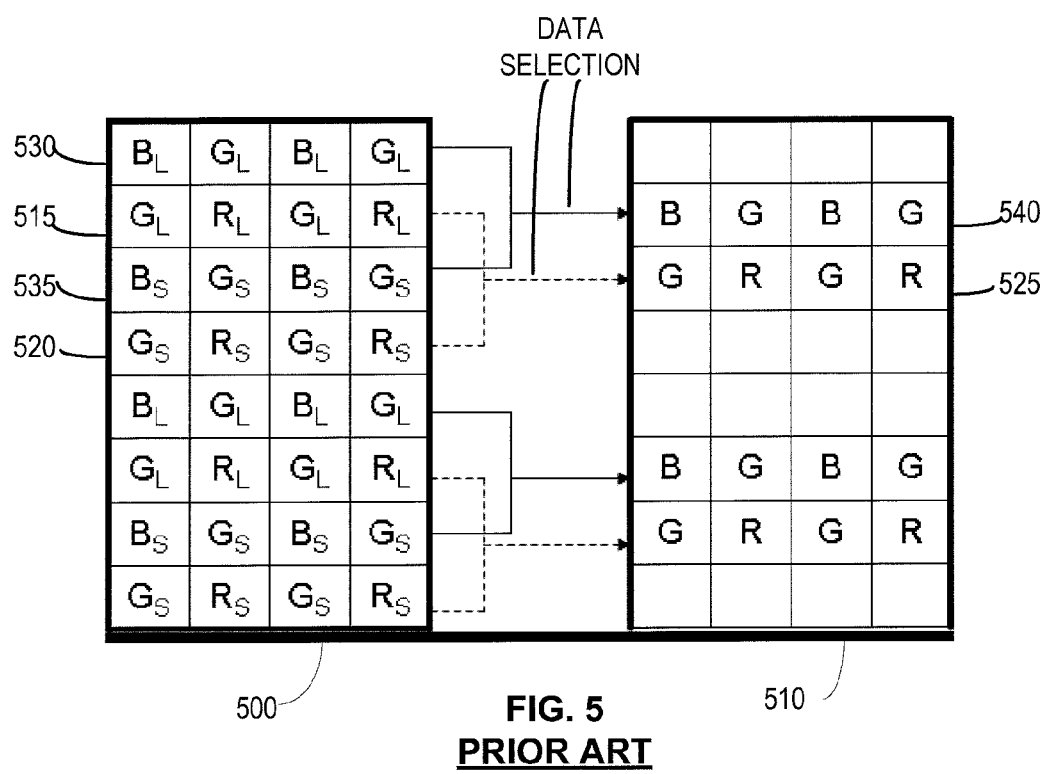
FIG. 5 illustrates prior art data selection between long exposure and short exposure for a conventional Bayer pattern in a down-sampling mode.

FIG. 5 illustrates HDR combination in a down-sampling mode for a prior art Bayer filter pattern sensor 500. Down-sampling from Bayer filter pattern sensor 500 gives down-sampling results 510 (in the right portion of FIG. 5). Within Bayer filter pattern sensor 500, subscripts indicate whether the pixel is configured as either long ($_L$) or short ($_S$) exposure time rows. Every pair of two nearest rows having the same color pattern but different exposure times have pixel data combined during down-sampling to give down-sampling results 510. GRGR row 525 results from selection between pixel values of GRGR row 515 and GRGR row 520. Similarly BGBG row 540 results from pixel value selection between BGBG row 530 and BGBG row 535. As noted above, the problem with prior art sensor that utilize the Bayer pattern, is that significant zigzagging results during the HDR combination process.

Figure 6:
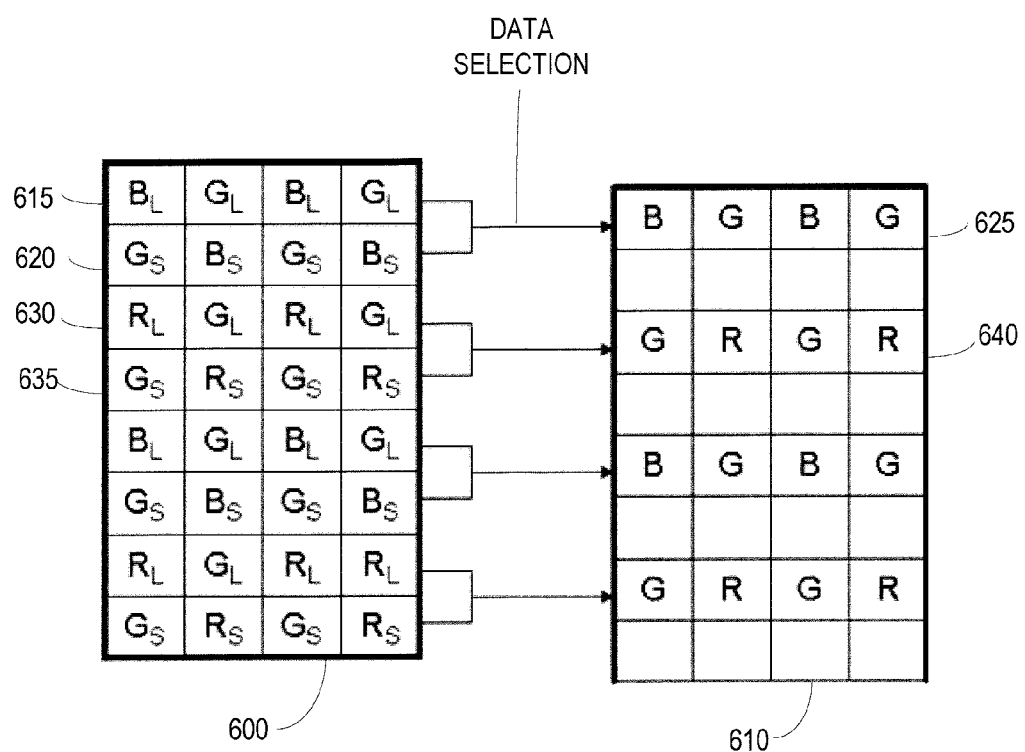
FIG. 6 illustrates data selection among long exposure and short exposure for an exemplary modified Bayer pattern in a down-sampling mode, according to an embodiment.

FIG. 6 illustrates HDR combination in a down-sampling mode for a modified Bayer pattern sensor 600. Modified Bayer filter pattern sensor 600 may represent a portion of image array 203 of FIG. 2; a down-sampling result 610 (shown in the right portion of FIG. 6) represents the result of down-sampling from modified Bayer filter pattern sensor 600, and has a conventional Bayer pattern as a result of HDR combination. Within modified Bayer filter pattern sensor 600, color sequences are similar to modified Bayer filter pattern sensor 400 of FIG. 4. Subscripts within each pixel indicate the configured exposure time as either long ($_L$) or short ($_S$). In the example of FIG. 6, row 615 has a long exposure time, row 620 has a short exposure time, row 630 has a long exposure time, and row 635 has a short exposure time. This sequence then repeats. The sequence is selected to be compatible with the modified Bayer pattern, which also repeats after every four rows. Adjacent rows of corresponding colors and different exposure times have pixel data combined during down-sampling. For example, a data selection of a long exposure time BGBG row 615 and a short exposure time GBGB row 620 to generate a single BGBG row 625 after down-sampling in which the G has selected data from the long and short exposure time pixel data (for the two green pixels from the rows with different exposure times), the R has selected data from long and short exposure time pixel data (for the two red pixels from the rows with different exposure times), and so on. Similarly one data is selected from a long exposure time RGRG row 630 and a short exposure time RGRG row 635 to generate a single GRGR row 640 after down-sampling.

Other common filter patterns may also repeat after every four rows, such that the principles illustrated in FIGS. 4 and 6 may be applied. For example, the CYGM pattern could be modified to have the following color pattern that repeats every four rows: cyan, yellow, cyan, yellow (row 1); yellow, cyan, yellow, cyan (row 2), green, magenta, green, magenta (row 3); and magenta, green, magenta, green (row 4). The RGBE, RGBC, and RGBW patterns could also be modified in similar manners, for example. Furthermore, it is anticipated that in alternate embodiments filter patterns are modified to repeat after more than four rows to achieve a reduction in vertical resolution larger than 1:2. For example, the Bayer pattern could be modified to have the following pattern that repeats every six row to achieve a 1:3 reduction in vertical resolution: blue, green, blue, green (row 1); green, blue, green, blue (row 2); blue, green, blue, green (row 3); red, green, red green (row 4); green, red, green, red (row 5); and red, green, red, green (row 6).

Binning for the modified Bayer pattern (e.g., modified Bayer pattern sensors 400 and 600) results in a uniform sampling and thereby minimizes zigzag edges, as compared to binning for conventional Bayer patterns. The HDR combination process also benefits from the modified Bayer pattern, and thus generates high quality images.

In a normal mode (i.e., when not down-sampling), captured image quality from a sensor utilizing the modified Bayer pattern (e.g., sensor 200 configured with modified Bayer pattern sensor 400) may not be as good as an image captured with a sensor configured with a conventional Bayer pattern. However, artifacts within the normal mode image captured from the sensor utilizing the modified Bayer pattern are minor compared to the zigzag problem, and these artifacts may be easily corrected by image processing algorithms.

As previously discussed, image sensor 200 supports a full resolution (i.e., row-by-row) readout of pixel data in which each row has the same exposure time. In a preferred embodiment, image sensor 200 has two modes of operation; (1) a normal full resolution mode with dynamic range limited by photosensors within each pixel, and (2) a down-sampling mode that has reduced vertical resolution. In the down-sampling mode, binning achieves high SNR when HDR is not required, while HDR combination achieves a higher dynamic range when HDR is desired. A comparatively small amount of chip 'real estate' is required for the additional functionality to provide the second pre-charge address block 225 and row independent exposure times for HDR combination. Only comparatively inexpensive modifications to processor 250 are required to implement the down-sampling mode with HDR combination. In essence "spare lines" are used during down-sampling to achieve a high dynamic range sensing mode at a very low marginal cost.

Down-sampling schemes of the prior art typically emphasize reduction of noise and gain, and the exposure time of each row remains nominally the same. Prior art down-sampling either discards data from a portion of the lines or averages data across multiple rows. Thus, these prior art down-sampling approaches do not increase the dynamic range of resulting image.

HDR combination may be implemented at least in part within the analog domain, such as using sample and hold registers or may be implemented in the digital domain, such as using analog to digital converters and software.

Where processor 250 represents a digital signal processor, down-sampling, such as binning and HDR combination, may be implemented as machine readable instructions stored in memory accessible by the processor. At least part of the embodiments disclosed herein may relate to a computer storage product with a computer-readable medium having computer code thereon for performing various computer-implemented operations. Examples of computer-readable media include, but are not limited to: magnetic media such as hard disks, floppy disks, and magnetic tape; optical media such as CD-ROMs, DVDs and holographic devices; magneto-optical media; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using Java, C++, or other object-oriented programming language and development tools. Another embodiment of the invention may be implemented in hardwired circuitry in place of, or in combination with, machine-executable software instructions.

Figure 7:
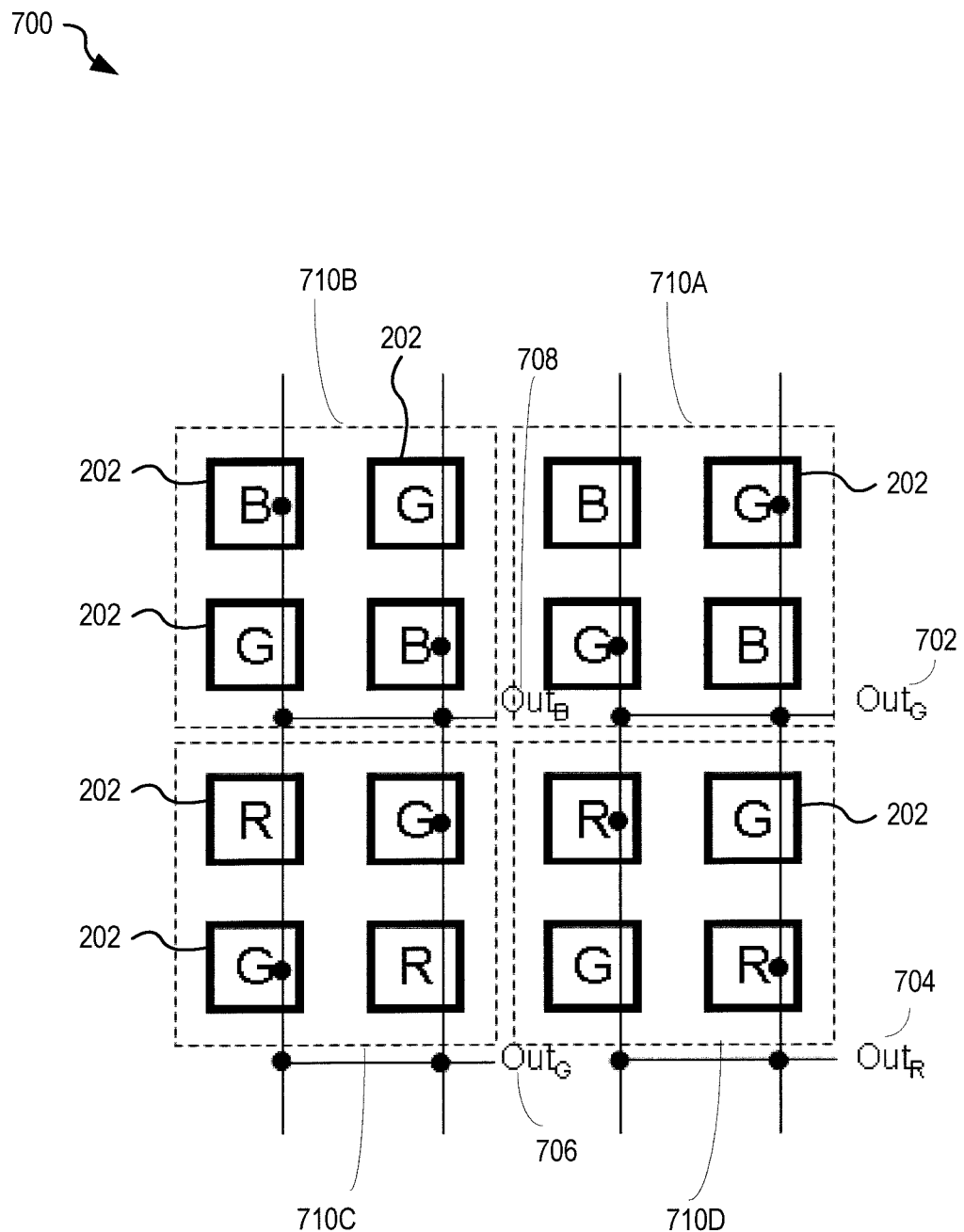
FIG. 7 shows a portion of a pixel array configured in a modified Bayer pattern illustrating exemplary connectivity for binning pixel data values to generate output data, according to an embodiment.

FIG. 7 shows a portion 700 of a pixel array in modified Bayer pattern configuration illustrating exemplary connectivity for binning pixel data values to generate output data in a conventional Bayer pattern. Portion 700 may represent a portion of image array 203 of FIG. 2. Portion 700 includes sixteen pixels 202 divided into subgroups 710A-D, each subgroup having four pixels. Portion 700 has four outputs 702, 704, 706, and 708. Output 702 combines data of two green pixels on a diagonal of subgroup 710A. Similarly, output 704 combines data of two red pixels of subgroup 710D, output 706 combines data of two green pixels of subgroup 710C, and output 708 combines data of two blue pixels of subgroup 710B. Outputs 708, 702, 706 and 704 thus generate two rows of two pixels arranged in a conventional Bayer pattern with a 2:1 reduction in vertical resolution and a 2:1 reduction in horizontal resolution.

Figure 8:
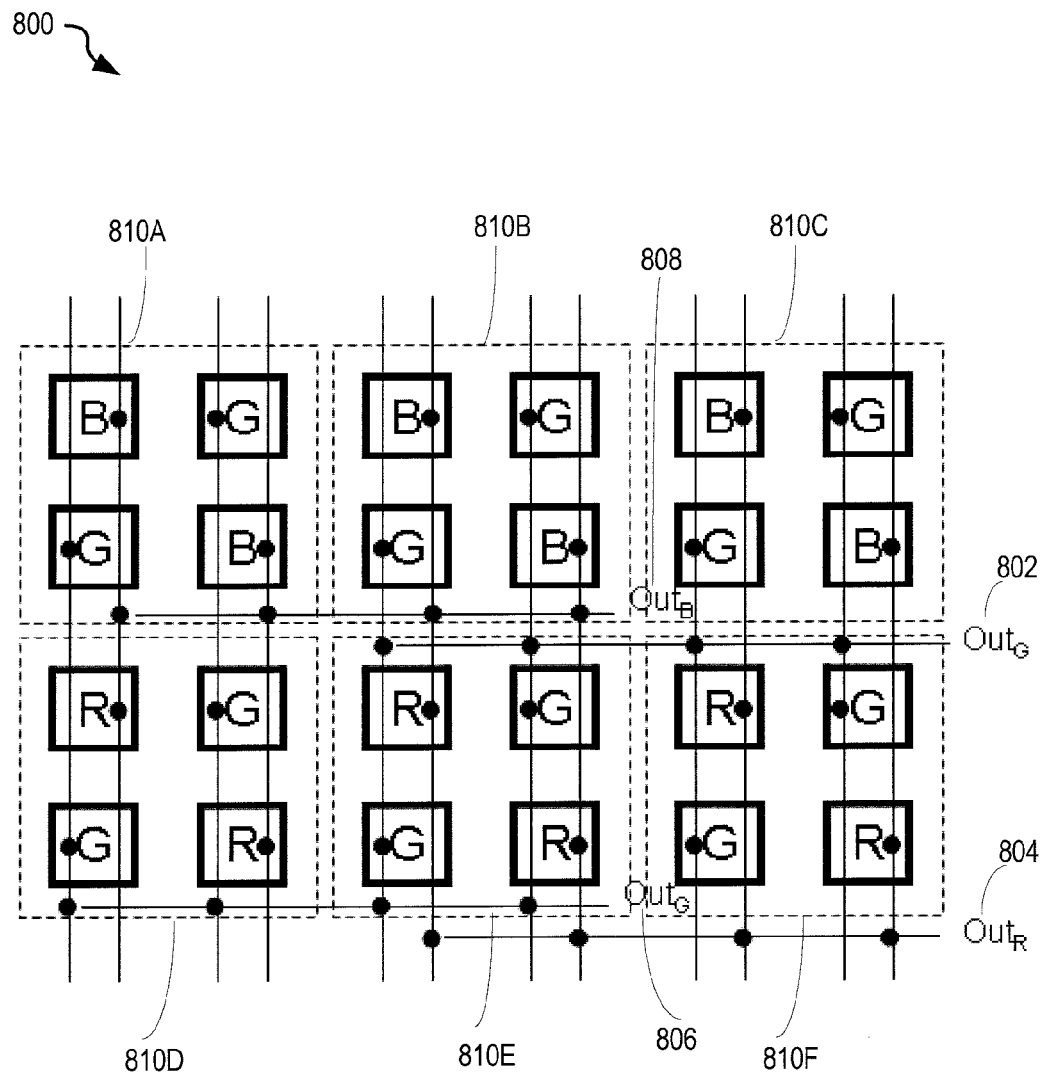
FIG. 8 shows a portion of a pixel array configured in a modified Bayer pattern illustrating alternate exemplary connectivity for binning pixel data values to generate output data, according to an embodiment.

FIG. 8 shows a portion 800 of a pixel array in modified Bayer pattern configuration illustrating alternate exemplary connectivity for binning pixel data values to generate output data in a conventional Bayer pattern. Portion 800 may represent a portion of image array 203 of FIG. 2. Portion 800 has twenty four pixels that are divided into six subgroups 810A-F of four pixels each. Each of subgroups 810A-C has four pixels with BG on a first row and GB on a second row next to the first row, and each of subgroups 810D-F has four pixels with RG on a first row and GR on a second row next to the first row. As illustrated in FIG. 8, outputs from each pair of pixels on a diagonal are combined, and then three pairs of the same color output are combined to generate green output 802, red output 804, green output 806, and blue output 808. Outputs 808, 802, 806 and 804 thus generate two rows of two pixels arranged in a conventional Bayer pattern with a 2:1 reduction in vertical resolution and a 3:1 reduction in horizontal resolution.

Figure 9:
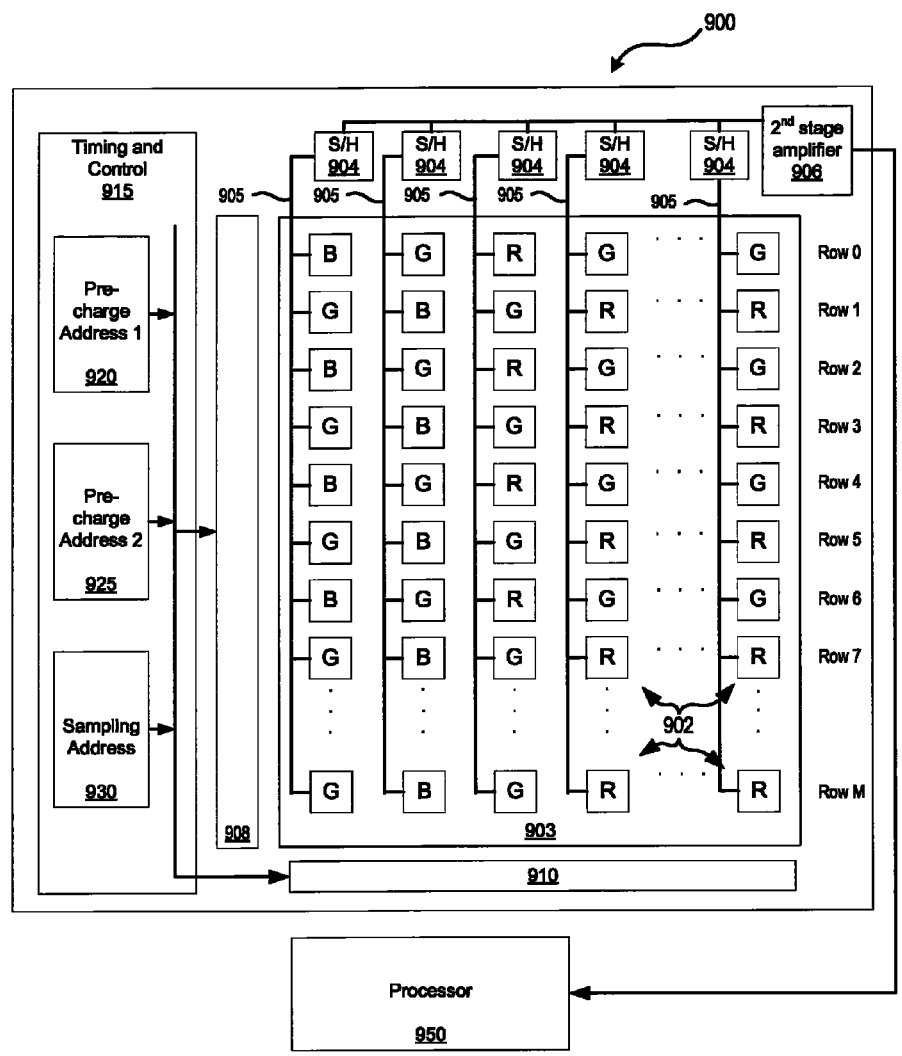
FIG. 9 illustrates binning for an exemplary rotated modified Bayer pattern in a down-sampling mode, according to an embodiment.

FIG. 9 is a block diagram illustrating one exemplary rotated modified Bayer pattern image sensor 900 that supports down-sampling with both a high dynamic range (HDR) combination and binning. Image sensor 900 is similar to image sensor 200 of FIG. 2, with the modified Bayer pattern of the filter array rotated by ninety degrees. Certain components are omitted for clarity of illustration. Image sensor 900 includes an image array 903 that has a plurality of light sensitive elements or photo-sensitive pixels 902 arranged as a plurality of rows and a plurality of columns and a filter array including a number of filter elements. Each filter element is in optical alignment with a respective pixel and is configured to allow light of only a certain color to pass through. The filter array conforms to a rotated modified Bayer pattern defining the color sensitivity of each pixel 902. That is, color of pixel sensors within image array 903 conform to the exemplary rotated modified Bayer pattern sensor 1000 of FIG. 10. Image sensor 900 may be implemented as a complementary metal-oxide-semiconductor (CMOS) image sensor where each pixel 902 includes a photodetector and associated circuitry that supports setting an exposure time and reading out pixel values.

As shown, image array 903 has a column parallel readout architecture where, for each row, pixels 902 are read out simultaneously and processed in parallel. For each column, a readout line 905 connects, in parallel, to pixels 902 of that column and to a sample and hold (S/H) element 904. Outputs of S/H elements 904 connect to a second stage amplifier 906, which in turn connects to a processor 950. Processor 950 processes signals (i.e., image sensor data) from amplifier 906 to generate an image. Processor 950 may be implemented as a digital signal processor having a local line memory.

A row address decoder 908 and a column address decoder 910 operate to decode signals from a timing and control block 915 to address pixels 902. Timing and control block 915 includes a first pre-charge address block 920, a second pre-charge address block 925, and a sampling address block 930. The first pre-charge address block 920 may be set to a first pre-charge value, and the second pre-charge address block 925 may be set to a second pre-charge value. In one example of operation, sampling address 930 of timing and control block 915 selects a row, and a pre-charge is applied to pixels of that row from either the first pre-charge address block or the second pre-charge address block.

In one embodiment, the first pre-charge address block 920 supports a full resolution mode with the same gain and exposure time setting for each row. The first pre-charge address block 920 also supports a down-sampling mode that reduces resolution and permits the same exposure time to be set for all the rows during binning to achieve high SNR. The first pre-charge address block 920 and the second pre-charge address block 925 cooperate to support a down-sampling mode that reduces resolution and permits different exposure times to be set for different rows during the HDR combination process to achieve high dynamic range. Additional pre-charge address blocks (not shown) may be included within timing and control block 915 to provide additional pre-charge values for additional down-sampling modes.

The resolution of an image generated by processor 950 using data from image sensor 900 depends upon how the raw pixel data generated by photo-sensitive pixel elements is sampled and processed to generate pixels for the processed image. The term "raw pixel data" is used to distinguish data generated by image sensor 900 from the pixel data after the raw data has been sampled and performed additional signal processing by processor 950. In particular, the raw pixel data received from image sensor 900 may be down-sampled to reduce the effective vertical resolution of the processed image. A variety of standard resolution formats are used in the image sensing art. For example, a 1.3 megapixel super extended graphics array (SXGA) format has 1280×924 pixels of resolution while a video graphics array (VGA) format has a resolution of 640×480 pixels.

In accordance with an embodiment, in a down-sampling mode, the vertical resolution of the raw pixel data is reduced by processor 950 to implement format conversion and simultaneously achieve a higher dynamic range. For example, when converting a 1.3 megapixel format into VGA, a down sampling mode may be selected that also provides a higher dynamic range. In this example, the down-sampling mode implements a 1:2 reduction in vertical resolution, and thus, since there is a simple geometric ratio of 1:2 in vertical resolution, down-sampling may combine data from two rows (e.g., Row 0 and Row 1) of pixels 902. In particular, processor 950 operates to combine raw pixel data values to generate pixel values in the final image. Where the first of the two rows being combined has a first pre-charge value (e.g., as set from the first pre-charge address block 920) and the second of the two rows has a second pre-charge value (e.g., as set from the second pre-charge address block 925), values resulting from two different exposure times controlled by the pre-charge values are processed by processor 950 to effectively increase the dynamic range of array 900, as compared to the dynamic range when full resolution is used. In one example, even rows (e.g., Row 0, Row 2, Row 4, . . . . Row M–1) have a long exposure time and odd rows (e.g., Row 1, Row 3, Row 5, . . . . Row M) have a short exposure time.

As previously described, in one embodiment, processor 950 includes a local line memory to store and synchronize the processing of lines having either the same or different row exposure times. In particular, the local memory may be used to store sets of long exposure rows and short exposure rows sampled at different times to permit aligning and combining rows with either the same or different exposure times. In one embodiment, during down-sampling, processor 950 reads the memory and combines the raw pixel data of pixels that are neighbors along the vertical dimension that are of a compatible type and that have the same exposure time for the binning process. In another embodiment, during down-sampling, processor 950 reads the memory and selects the raw pixel data of pixels that are neighbors along the vertical dimension that are of a compatible type and that have the different exposure times for the HDR combination process.

The exposure time of a pixel affects its output response. When a pixel is operated with a long exposure time, the pixel is very sensitive to received light, but tends to saturate at a low light level. In contrast, when the pixel is operated with a short exposure time, the pixel is less sensitive to light, and saturates at a higher light level as compared to operation with a short exposure time. Thus, by using different exposure times for rows that are down-sampled, a higher dynamic range is achieved as compared to down-sampling of rows with the same exposure time.

Various extensions and modifications of the down-sampling mode with high dynamic range are contemplated. In a first scenario, any down-sampling mode with a 1:N reduction (where N is an integer value) in vertical resolution may be supported, such as 1:2, 1:3, 1:4 and so on. In this scenario, the exposure times of the rows are varied in an interleaved sequence of row exposure times that permits down-sampling to be achieved with increased dynamic range. For example, for down-sampling with a 1:3 reduction in vertical resolution, the three rows that are to be combined have a sequence of a long exposure time, medium exposure time, and short exposure time.

In the HDR combination process, implemented within processor 950, rows of pixels have different exposure times. By combining data from two or more pixels of rows having different exposure times, dynamic range may be increased. There are many ways of combining the data from long exposure pixels and short exposure pixels. In one way, data is selected from either the long exposure pixel or the short exposure pixel. In particular, data from pixels of long exposure time (L pixels) are selected by processor 950 where the L pixels are not saturated, and data from pixels of short exposure time (S pixels) are selected by processor 950 where the L pixels are saturated. Where the short exposure data is selected by processor 950, the S pixel data is normalized to match the scale of long exposure pixels. For example, $$\text{data}_N = \text{data}_O * (L\_exposuretime / S\_exposuretime) \qquad (2)$$

Where $\text{data}_N$ is the determined normalized pixel data value, $\text{data}_O$ is the original pixel data value, L_exposuretime represents the long exposure time, and S_exposuretime represents the exposure time of the selected pixel data value. If the pixel data value selected has the short exposure time, $\text{data}_N$ is normalized based upon the long exposure time as shown in Equation (1). If the pixel data value selected has the long exposure time, $\text{data}_N$ is the same as $\text{data}_O$.

In one embodiment, when HDR combination is not required, all rows of pixels are configured to have the same exposure time. Binning of two rows having the same exposure time achieves a higher signal to noise ratio (SNR) in the down-sampling.

Down-sampling modes that have higher dynamic range are also compatible with a variety of color filter array formats. In color sensing arrays in the art, a color filter array pattern is applied to an array of photosensors such that output from the photosensors creates a color image. The incoming light to each photosensor is filtered such that typically each photosensor in the pixel array records only one color, such as red, green or blue. In one embodiment, for a particular color filter array pattern, the row exposure times used in down-sampling are selected such that pixels having compatible filter types are combined during down-sampling.

Figure 10:
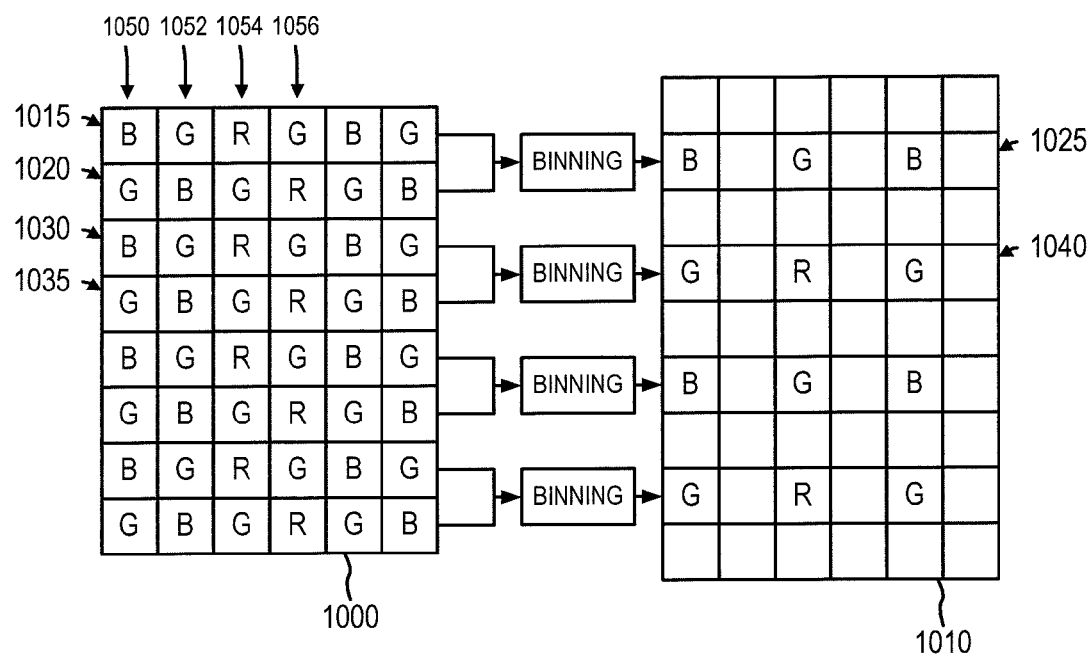
FIG. 10 is a block diagram illustrating one exemplary rotated modified Bayer pattern image sensor that supports down-sampling with both a high dynamic range (HDR) combination and binning, according to an embodiment.

FIG. 10 illustrates exemplary binning in a down-sampling mode for a rotated modified Bayer pattern sensor 1000. Rotated modified Bayer pattern sensor 1000 may represent image array 903 of FIG. 9; a down sampling result 1010 (the right portion of FIG. 10) illustrates binning results after down-sampling and has a conventional Bayer pattern as a result of binning. In the rotated modified Bayer pattern sensor 1000, a blue-green-red-green row 1015 of pixels is followed by a green-blue-green-red row 1020 of pixels, which is followed by a blue-green-red-green row 1030 of pixels, which is followed by a green-blue-green-red row 1035 of pixels. Within the rotated modified Bayer pattern sensor 1000, the rows of colors repeat every two rows and the columns repeat every four columns The other modified Bayer patterns discussed above (e.g., modified CYGM, RGBE, RGBC, and RGBW) could also be rotated in a similar manner.

With the rotated modified Bayer pattern sensor 1000, the columns have four color patterns that repeat every four rows: Blue-Green-Blue-Green (BGBG) 1050, Green-Blue-Green-Blue (GBGB) 1052, Red-Green-Red-Green (RGRG) 1054, and Green-Red-Green-Red (GRGR) 1056, and so on in repeating sequence. In this example all rows have the same exposure time. The repeating sequence is selected to be compatible with the modified Bayer pattern, which also repeats after every four rows. Binning of BGBG row 1015 and GBGB row 1020 generates a single BGBG row 1025 after down-sampling in which the G combines data from the two green pixels of the two rows having the same exposure times, the B combines data from the two blue pixels of the two rows having the same exposure times, and so on. Similarly binning of RGRG row 1030 and GRGR row 1035 generates a single GRGR row 1040 after down-sampling. It should be noted that in this example, both horizontal and vertical down-sampling results.

According to embodiments of the present invention, the modified Bayer filter pattern and rotated modified Bayer filter pattern may be used in, but is not limited to, high resolution sensors, and low noise and high sensitivity sensors for HD video. The use of higher resolution (than needed for a final image resolution) sensors (e.g., image sensor 200, FIG. 2 and image sensor 900, FIG. 9) and the above described binning technique improves sharpness and resolution with minimized zigzag edges in the final image. Where an image sensor (e.g., image sensor 200, FIG. 2 and image sensor 900, FIG. 9) also optionally implements down-sampling, such as binning and HDR combination to generate output, these sensors also benefit from use of the modified Bayer filter pattern and the rotated modified Bayer filter pattern for improved image quality.

Other improvements may be realized through use of sensor 200 with a modified Bayer pattern sensor array (e.g., image array 203) and image sensor 900 with a rotated modified Bayer pattern sensor array (e.g., image array 903, FIG. 9), beyond the above described improvements in image quality. For example, cost may be reduced for system on a chip (SOC) image sensors. For sensors that output raw image data, an extra memory buffer may be required for Bayer pattern output. However, such raw image sensors may also share memory with other processing modules, such as defect pixel correction (DPC) and automatic white balance (AWB) processors.

Having described several embodiments, it will be recognized by those skilled in the art that various modifications, alternative constructions, and equivalents may be used without departing from the spirit of the invention, for example, variations in sequence of steps and configuration and number of pixels, etc. Additionally, a number of well known processes and elements have not been described in order to avoid unnecessarily obscuring the present invention. Accordingly, the above description should not be taken as limiting the scope of the invention.

It should thus be noted that the matter contained in the above description or shown in the accompanying drawings should be interpreted as illustrative and not in a limiting sense. The following claims are intended to cover generic and specific features described herein, as well as all statements of the scope of the present method and system, which, as a matter of language, might be the to fall there between.

What is claimed is:

1. A method for down-sampling an image produced by an image sensor including an array of light sensitive elements, comprising:

filtering light incident on the image sensor such that the image sensor receives light having a repeating pattern characterized by:

light sensitive elements in at least two successive columns alternately receiving light having a first color and a second color, and light sensitive elements in common rows of the at least two successive columns alternately receiving light having the first color and the second color, and light sensitive elements in at least two additional successive columns alternately receive light having a third and a fourth color, and light sensitive elements in common rows of the at least two additional successive columns alternately receiving light having the third color and the fourth color;

sampling output values of the light sensitive elements;

combining output values of pairs of light sensitive elements receiving light of a common color and from successive rows of the array to generate a down-sampled image, the step of combining including, for each pair of light sensitive elements:

selecting a value from a light sensitive element of the pair having a long exposure time when the light sensitive element having a long exposure time has not saturated, and selecting a value from a light sensitive element of the pair having a short exposure time when the light sensitive element having a long exposure time has saturated, the value being normalized to the value of the light sensitive element of the pair having the long exposure time; and configuring the light sensitive elements such that light sensitive elements of successive rows alternately have long and short exposure times, wherein the down-sampled image has increased dynamic range.

2. The method of claim 1, the first and fourth colors being the color green, the second color being the color blue, and the third color being the color red.

3. A method for down-sampling an image produced by an image sensor including an array of light sensitive elements, comprising:

filtering light incident on the image sensor such that successive rows of the array of light sensitive elements alternately receive light having a first pattern and a second pattern, the first pattern characterized by each four successive light sensitive elements in a row respectively receiving blue, green, red, and green colored light, and the second pattern characterized by each four successive light sensitive elements in a row respectively receiving green, blue, green, and red colored light;

sampling output values of the light sensitive elements; and combining output values of pairs of light sensitive elements receiving light of a common color and from successive rows of the array to generate a down-sampled image, the step of combining including, for each pair of light sensitive elements:

selecting a value from a light sensitive element of the pair having a long exposure time when the light sensitive element having a long exposure time has not saturated, and selecting a value from a light sensitive element of the pair having a short exposure time when the light sensitive element having a long exposure time has saturated, the value being normalized to the value of the light sensitive element of the pair having the long exposure time; and, configuring the light sensitive elements such that light sensitive elements of successive rows alternately have long and short exposure times, wherein the down-samples image has an increased dynamic range.

\* \* \* \* \*